United States Patent
Dede et al.

(10) Patent No.: US 10,149,413 B1
(45) Date of Patent: Dec. 4, 2018

(54) INTEGRATED THERMAL MANAGEMENT ASSEMBLY FOR GATE DRIVERS AND POWER COMPONENTS

(71) Applicant: Toyota Motor Engineering & Manufacturing North America, Inc., Erlanger, KY (US)

(72) Inventors: Ercan M. Dede, Ann Arbor, MI (US); Jongwon Shin, Ann Arbor, MI (US); Jae Seung Lee, Ann Arbor, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 0 days.

(21) Appl. No.: 15/665,158

(22) Filed: Jul. 31, 2017

(51) Int. Cl.
H05K 7/20 (2006.01)
H01L 23/473 (2006.01)
H01L 23/427 (2006.01)

(52) U.S. Cl.
CPC ....... *H05K 7/20927* (2013.01); *H01L 23/427* (2013.01); *H05K 7/209* (2013.01); *H05K 7/20909* (2013.01); *H01L 23/473* (2013.01); *H05K 7/20936* (2013.01)

(58) Field of Classification Search
CPC . H05K 7/209; H05K 7/20927; H05K 7/20936
USPC ........................ 361/679.46–679.54, 688–723; 165/80.1–80.5, 104.33; 257/712–722
See application file for complete search history.

(56) References Cited

U.S. PATENT DOCUMENTS

| | | | |
|---|---|---|---|
| 6,661,659 B2 * | 12/2003 | Tamba | H05K 7/20927 165/80.4 |
| 6,898,072 B2 | 5/2005 | Beihoff et al. | |
| 6,909,607 B2 | 6/2005 | Radosevich et al. | |
| 6,849,943 B2 | 12/2005 | Thurk et al. | |
| 7,764,041 B2 | 7/2010 | Schnetzka et al. | |
| 9,142,484 B2 | 9/2015 | Delgado et al. | |

OTHER PUBLICATIONS

An et al.; "*Full SiC Power Module with Substrate Integrated Liquid Cooling for Battery Electric Vehicles*"; CIPS 2016—9th International Conference on Integrated Power Electronics Systems (6 pages).
Chinthavali et al.; "*A 10-k SiC Inverter with a Novel Printed Metal Power Module with Integrated Cooling Using Additive Manufacturing*"; IEEE 2014; pp. 48-54 (7 pages).
(Continued)

Primary Examiner — Zachary Pape
(74) Attorney, Agent, or Firm — Snell & Wilmer LLP (57) ABSTRACT

An integrated thermal management assembly, device or system for a power conversion device having a driver board and a power board. The integrated thermal management assembly includes a double-sided cooler. The double-sided cooler has a first layer that includes a first surface that is positioned below an inner surface of the power board. The double-sided cooler has a second surface positioned above an inner surface of the driver board. The double-sided cooler includes a first coolant channel in between the first surface and the second surface. The thermal integrated assembly includes a coolant that flows within the first coolant channel and that is configured to dissipate heat projected through the double-sided cooler.

20 Claims, 4 Drawing Sheets

(56) References Cited

OTHER PUBLICATIONS

Gerber et al.; "*System Integration in Automotive Power Systems*"; EPE 2005—Dresden; (10 pages).
Lai et al.; "*A Hybrid Switch Based Soft-Switching Inverter for Ultrahigh Efficiency Traction Motor Drives*"; IEEE 2012; pp. 4145-4151 (7 pages).
Lee et al.; "*IPEM-Based Power Electronics System Integration*"; Center for Power Electronic Systems, The Bradley Department of Electrical and Computer Engineering Department Virginia Polytechnic Institute and State University (14 pages).
Liang et al.; "*Functional Integration in Active IPEM by Using a Planar Integration Technology*"; IEEE 2005; pp. 375-381 (7 pages).
Zhenxian Liang; "*WiPDA 2014 Tutorial: Packaging Technologies to Exploit the Attributes of WBG Power Electronics*"; Oak Ridge National Laboratory (73 pages).
Meysenc et al.; "*Power Electronics Cooling Effectiveness Versus Thermal Inertia*"; IEEE Transactions on Power Electronics, vol. 20, No. 3, May 2005; pp. 687-693 (7 pages).
Ying Feng Pang; "*Assessment of Thermal Behavior and Development of Thermal Design Guidelines for Integrated Power Electronics Modules*"; Dissertation submitted to Virginia Polytechnic Institute and State University, Jan. 20, 2005 (164 pages).

\* cited by examiner

INTEGRATED THERMAL MANAGEMENT ASSEMBLY FOR GATE DRIVERS AND POWER COMPONENTS

BACKGROUND

1. Field

This specification relates to a system, an assembly and a device for thermal management of a power conversion device.

2. Description of the Related Art

A power semiconductor switch device ("power switch") is a semiconductor device that acts as a switch in power electronics. A gate driver generates a pulse waveform to turn on and off the power switch. The temperature of the gate driver is affected by the characteristics of the power switch. In particular, the temperature of the gate driver is affected by thermal resistance of the gate driver, the input capacitance of the power switch, the voltage difference between the on-state and the off-state, the ambient temperature of the system and the switching frequency of the power switch. For example, as the switching frequency of the power switch increases, the temperature of the gate driver also increases.

The next-generation wide band-gap switches, formed using Silicon Carbide (SiC) or Gallium Nitride (GaN), operate at a higher frequency than conventional Silicon (Si) power switches. As a result, the gate drivers for a next-generation wide band-gap switch generates more heat than a conventional power switch, and thus, the heat needs to be managed to prevent damage and/or a loss of efficiency.

A heat sinking device may be coupled to a heat generating device, such as a power electronic device, to manage the heat. A heat sink is a passive heat exchanger that transfers heat generated by a power electronic device to dissipate away from the power electronic device. Heat sinking devices remove heat and lower the maximum operating temperature of the heat generating device. The heat sinking device is often separate from that of the power electronic device. The separate components add additional cost, complexity and redundancy that is not necessarily needed.

Accordingly, there is a need for a system and a method to provide thermal management of the power switch while maintaining and/or improving performance and packaging.

SUMMARY

In general, one aspect of the subject matter described in this specification is embodied in an integrated thermal management assembly for a power conversion device having a driver board and a power board. The integrated thermal management assembly includes a double-sided cooler. The double-sided cooler has a first layer that includes a first surface that is positioned below an inner surface of the power board. The double-sided cooler has a second surface positioned above an inner surface of the driver board. The double-sided cooler includes a first coolant channel in between the first surface and the second surface. The thermal management assembly includes a coolant that flows within the first coolant channel and that is configured to dissipate heat projected through the double-sided cooler.

These and other embodiments may optionally include one or more of the following features. The double-sided cooler may have a second layer that includes a second coolant channel. The coolant may flow within the second coolant channel and may be a liquid coolant and/or air.

The double-sided cooler may have one or more fluid conduits that connect the first layer and the second layer. The one or more fluid conduits may be configured to pass the coolant between the coolant channels of the first layer and the second layer. The one or more fluid conduits may include a first fluid conduit and a second fluid conduit. The first fluid conduit may be positioned at one end of the double-sided cooler and the second fluid conduit may be positioned at an opposite end of the double-sided cooler.

The double-sided cooler may have a second layer that has a second coolant channel. The second layer may be configured as a heat spreader.

The double-sided cooler may have an inner surface that is shaped as a step to increase a surface area that is contact with the coolant within the first coolant channel. The amount of heat that is dissipated may be directly correlated with the amount of surface area of the inner surface of the double-sided cooler that is in contact with the coolant. The double-sided cooler may have an inner surface that may have one or more recesses or fins to increase the surface area that is in contact with the coolant within the first coolant channel.

In another aspect, the subject matter is embodied in an integrated thermal management assembly for a power conversion device having a driver board and a power board. The integrated thermal management assembly includes a double-sided cooler positioned between the driver board and the power board. The double-sided cooler has a first layer that includes a first surface, a second surface and a first cavity in between the first surface and the second surface. The first surface having a recess, fins or a step. The integrated thermal management assembly has a coolant that flows within the first cavity and that is configured to dissipate heat projected through the double-sided cooler.

In another aspect, the subject matter is embodied in an integrated thermal management assembly for a power conversion device having a driver board and a power board. The integrated thermal management assembly includes a double-sided cooler positioned between the driver board and the power board. The double sided cooler has a first layer that includes a first surface, a second surface and a first cavity in between the first surface and the second surface and a second layer that includes a second cavity. The integrated thermal management assembly includes a liquid coolant that flows within the first cavity and that is configured to dissipate heat projected through the double-sided cooler. The integrated thermal management assembly includes a fluid conduit or a heat pipe that connects the first layer and the second layer. The integrated thermal management assembly includes a second layer that is a heat spreader or a secondary liquid or an air cooler.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

DETAILED DESCRIPTION

Disclosed herein are systems, assemblies and devices for thermally managing a power electronic device. Particular embodiments of the subject matter described in this specification may be implemented to realize one or more of the following advantages.

The thermal management assembly is integrated within a power electronic device. The thermal management assembly may cool and/or dissipate heat originating from the one or more gate drivers, the power semiconductor device and/or the magnetic core, such as a ferrite core. In particular, the thermal management assembly may be positioned between the power board and the driver board. As such, heat within the power electronic device flows along thermal paths that are directed toward the thermal management assembly. For example, the heat generated by the gate driver integrated circuit (IC), the printed circuit board (PCB) winding, and other power components, such as the power module and/or the magnetic core, flow along the thermal paths toward the thermal management assembly. The thermal management assembly includes a custom double-sided cooler that contains a coolant, such as a liquid coolant, that dissipates the heat. The thermal management assembly is positioned or integrated within the power electronic device which simplifies the configuration of the power electronic device and eliminates the need for an additional or separate cooling apparatus for the gate driver IC. Moreover, the elimination of the need for the additional or separate cooling apparatus reduces cost, size and maintenance. The reduction in size allows for the space to be utilized for other components, such as in a vehicle. The reduction in size may result in a reduction in weight which may increase the fuel efficiency of the vehicle.

Other benefits and advantages include customizing the double-sided cooler into different shapes and/or sizes and using different types of coolant within the coolant channel of the double-sided cooler. By customizing the shape, the size, and/or the type of the coolant, the thermal management assembly is able to manage the amount and/or the rate of heat dissipation. Additionally, the double-sided cooler may have multiple layers of coolant or a separate heat spreader to further direct and control heat dissipation. By more efficiently controlling heat dissipation, the thermal management assembly may improve reliability and increase durability of the power electronic device while reducing natural aging and/or damage.

Figure 1:
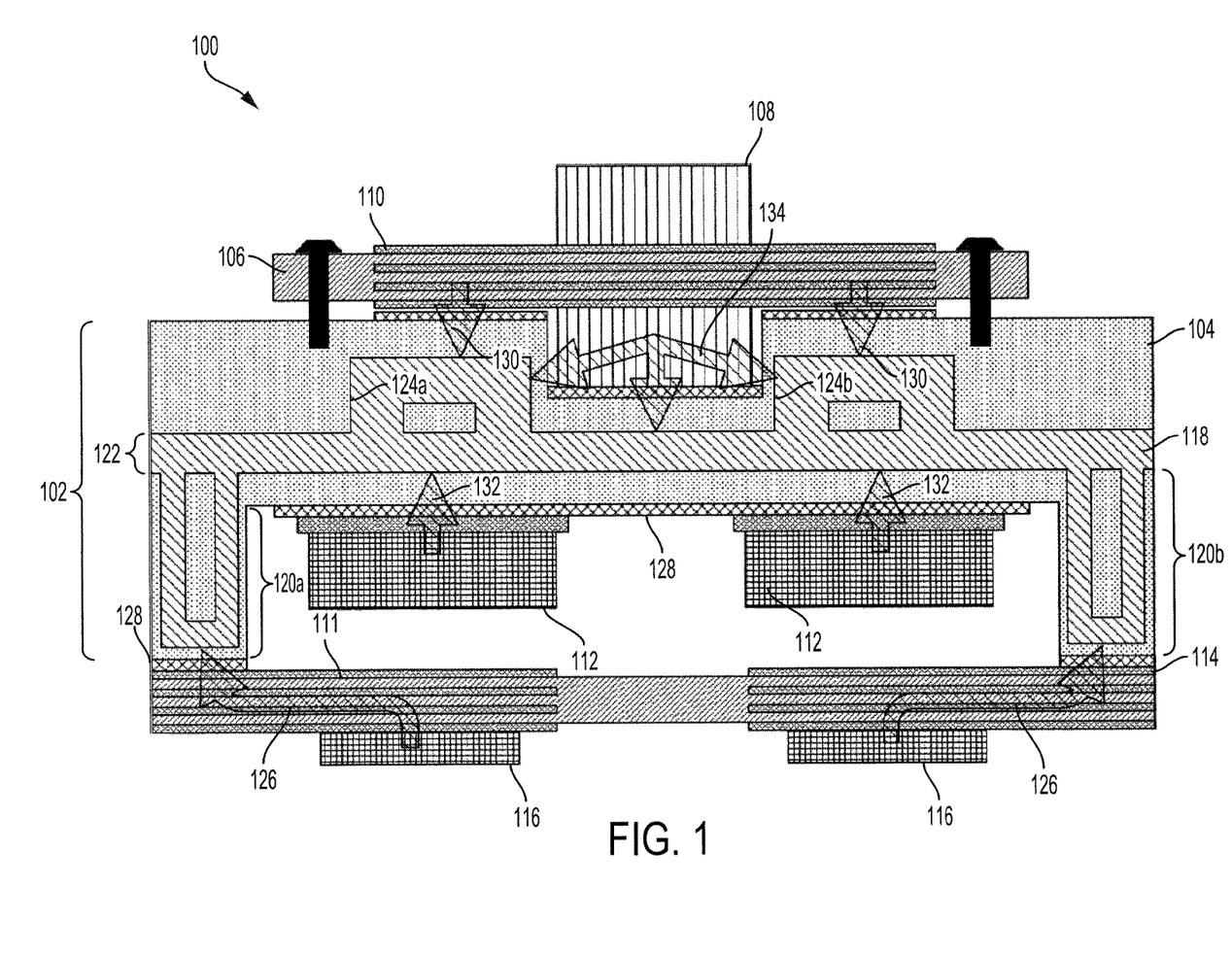
FIG. 1 is a cross-sectional view of a power electronic device having a thermal management assembly with a custom double-sided cooler shaped with one or more recesses according to an aspect of the invention.

FIG. 1 is a cross-sectional view of an example power electronic device 100 having an integrated thermal management assembly 102. The power electronic device 100 may have a power board 106, a magnetic core, such as a ferrite core 108, a thermal management assembly 102, a printed circuit board (PCB) winding 110, one or more power modules 112, a driver board 114, a thermal interface material (TIM) 128 and one or more gate driver integrated circuits (ICs) ("gate drivers") 116.

The power electronic device 100 has an integrated thermal management assembly ("thermal management assembly") 102. The thermal management assembly 102 is integrated within the power electronic device 100 and is positioned in between the power board 106 and the driver board 114. The thermal management assembly 102 is electrically and thermally connected to the components of the power electronic device 100. The components of the power electronic device 100 are configured, such that the thermal heat generated from the one or more gate drivers 116, the one or more power modules 112, the PCB winding 110 and the ferrite core 108 flow along thermal paths 126, 130, 132, 134 and is dissipated by the coolant 118 of the thermal management assembly 102.

The power electronic device 100 includes a driver board 114. The driver board 114 has a PCB trace 111 and one or more gate drivers 116. The PCB trace 11 may be made from copper or other electrically conductive material. The gate drivers 116 may generate heat and transfer heat along the thermal path 126 through the driver board 114 to the thermal management assembly 102. The one or more gate drivers 116 may be positioned on or below the driver board 114 and electrically connected to the driver board 114. The one or more gate drivers 116 may drive a voltage through the one or more power modules 112 or switches. The gate driver 116 may be a power amplifier that accepts a low-power input from a controller integrated circuit (IC) and produces a high-current drive input for the gate of a high-power transistor, such as an insulated-gate bipolar transistor (IGBT) or a power metal oxide semiconductor field-effect transistor (MOSFET).

The power electronic device 100 includes one or more power modules 112 that are positioned above the driver board 114 and below the power board 106 and the thermal management assembly 102. The one or more power modules 112 may generate heat that flows through the thermal path 132 to the cooler 104 where the coolant 118 dissipates the heat.

The power electronic device 100 includes a power board 106. The power board 106 has a PCB winding 110. The PCB winding 110, which may be made of a copper material, generates heat that is transferred along the thermal path 130 down through the power board 106 to the thermal management assembly 102 where the heat is dissipated by the coolant 118.

The power electronic device 100 includes a magnetic core, such as the ferrite core 108. The magnetic core, such as the ferrite core 108, confines and guides the magnetic fields in the power electronic device 100. The magnetic core generates heat that is transferred along the thermal path 134 down through to the thermal management assembly 102 where the heat is dissipated.

The power electronic device 100 may include one or more layers of TIM 128. The TIM 128 is made from an electrically insulative material that is thermally conductive and passes heat. The TIM 128 separates a heat sink from a heat source, such as a heat generating component. The one or more layers of TIM 128 may be positioned between a heat generating component, such as the one or more power modules 112, the one or more gate drivers 116, the magnetic core, or the PCB winding 110, and the thermal management assembly 102. The one or more layers of TIM 128 may be positioned along the thermal paths 126, 130, 132, 134, such that the heat from the heat generating component passes through the TIM 128 to the thermal management assembly 102. The one or more layers of TIM 128 electrically isolate and/or insulate the power electronic components, such as the power board 106 and/or the driver board 114 from the thermal management assembly 102.

The power electronic device 100 includes a thermal management assembly 102. The thermal management assembly 102 is integrated with the power electronic device 100. By integrating the thermal management assembly 102 with the components of the power electronic device 100, the overall size of the combined power electronic device 100 and thermal management assembly 102 is reduced. Moreover, the overall weight decreases. This results in increased efficiencies and performance.

The thermal management assembly 102 is positioned between the power board 106 and the driver board 114. The thermal management assembly 102 is positioned to dissipate thermal heat that is expelled and/or discharged from the PCB winding 110, the one or more power modules 112, the ferrite core 108 and/or the one or more gate drivers 116.

The thermal management assembly 102 includes a custom double-sided cooler ("cooler") 104 and a coolant 118. The cooler 104 may be made from a highly conductive metal, such as aluminum or copper, and may be optimized into different shapes and sizes. The cooler 104 may have different geometries. For example, the cooler 104 may be shaped such that the cooler 104 is parallel to the driver board 114 and/or the power board 106. In another example, the cooler 104 may be normal or perpendicular to the power board 106 and/or the driver board 114. In another example, the cooler 104 may extend to both the power board 106 and the driver board 114 along posts 120a-b.

The cooler 104 has an inner surface that is exposed to and/or in contact with the coolant 118. The inner surface of the cooler 104 defines a coolant channel 122 or a cavity within the cooler 104. The coolant channel 122 may correspond in shape to the cooler 104. The shape and/or geometry of the coolant channel 122 and the cooler 104 may control the rate and/or amount of heat that is dissipated in portions of the power electronic device 100 and the total rate and/or amount of heat that is dissipated in the power electronic device 100. The shape of the coolant channel 122 and/or the cooler 104 directs the flow of the coolant 118 within the coolant channel 122.

Figure 2:
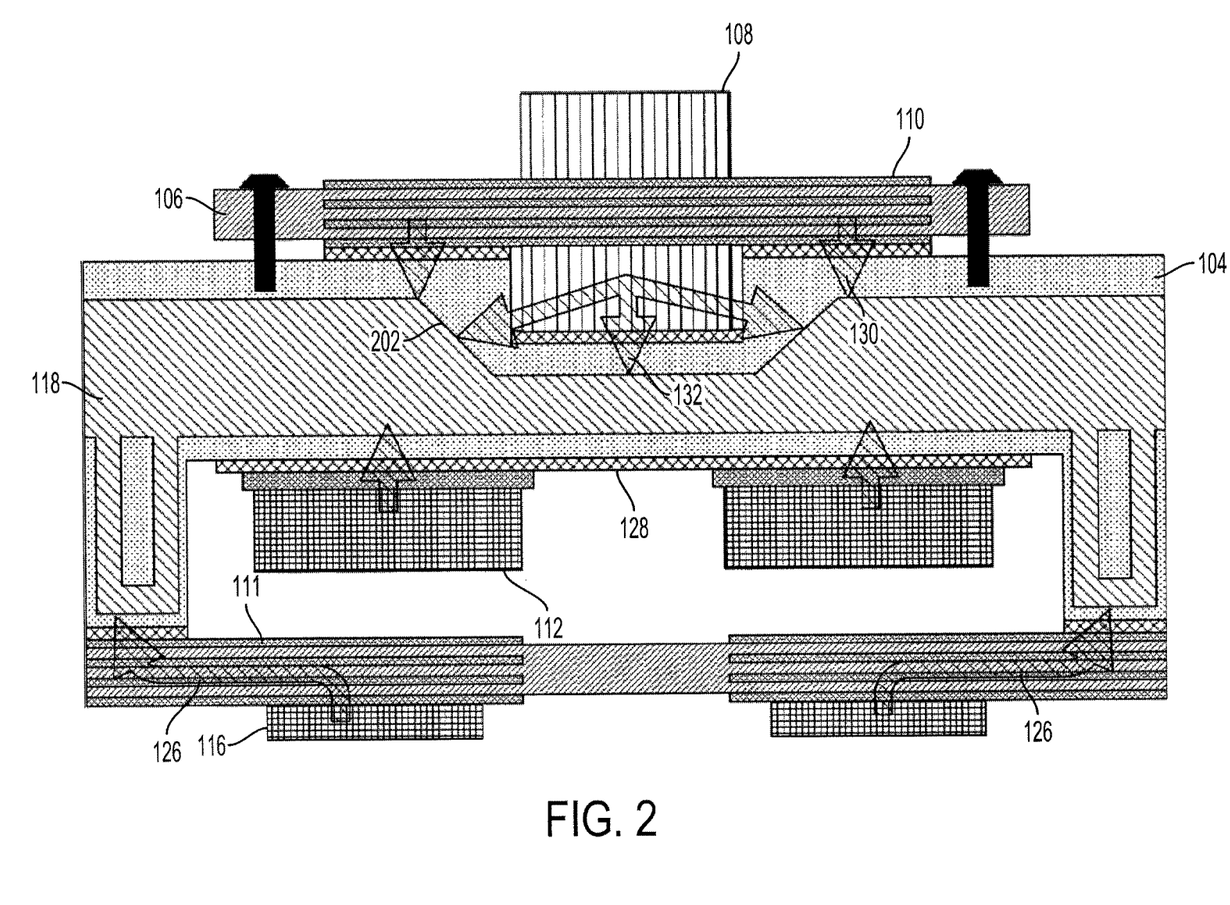
FIG. 2 is a cross-sectional view of the power electronic device of FIG. 1 having a thermal management assembly with a custom double-sided cooler shaped with a step structure according to an aspect of the invention.

For example, the coolant channel 122 may flow along the sides of the power electronic device 100 between the power board 106 and the driver board 114 to dissipate heat along the sides of the power electronic device 100. The coolant channel 122 may be parallel to the power board 106 and positioned below the power board 106 to dissipate the heat resulting from the PCB windings 110. In another example, the inner surface may have one or more recesses 124a-b, one or more fins (not shown) or a step structure 202 to increase an amount of surface area that is exposed and/or in contact with the coolant 118. One or more passive electronic elements, such as a magnetic or capacitor component, may be embedded within the recess, fins or step structure to dissipate heat. FIG. 1 shows the power electronic device 100 having a cooler 104 with an inner surface with one or more recesses 124a-b. FIG. 2 shows the power electronic device 100 having a cooler 104 with an inner surface with a step structure 202.

The coolant channel 122 may have a liquid coolant and/or air that flows through the coolant channel 122. The liquid coolant and/or air that flows through the coolant channel 122 dissipates the heat that is flowing along the thermal paths 126, 130, 132, 134 from the power components.

The amount of surface area of the coolant channel 122 or the inner surface of the cooler 104 that is in contact with the coolant 118 is directly correlated with the amount or rate of heat dissipation by the thermal management assembly 102. That is, the amount of heat that may be dissipated by the coolant 118 increases as the amount of surface area that is in contact with the coolant 118 increases and decreases as the amount of surface area that is in contact with the coolant 118 decreases. Other factors including the thermo-physical properties and type of coolant may affect the amount or rate of heat dissipation, as a liquid coolant that has a higher Mouromtseff, Mo ($\rho$, k, $C_p$, $\mu$) number provides a higher heat transfer rate than air. An increase in the amount or the rate of heat dissipation allows the one or more gate drivers 116 to operate at a higher frequency in oscillating one or more power switches between the on and off positions. This provides better thermal management for next-generation wide band-gap switches that operate at a higher frequency than conventional power switches. Moreover, the capability to operate at the higher frequency allows for the use of a smaller magnetic core, such as the ferrite core 108. A smaller magnetic core may result in cost savings and/or space efficiencies.

Figure 3:
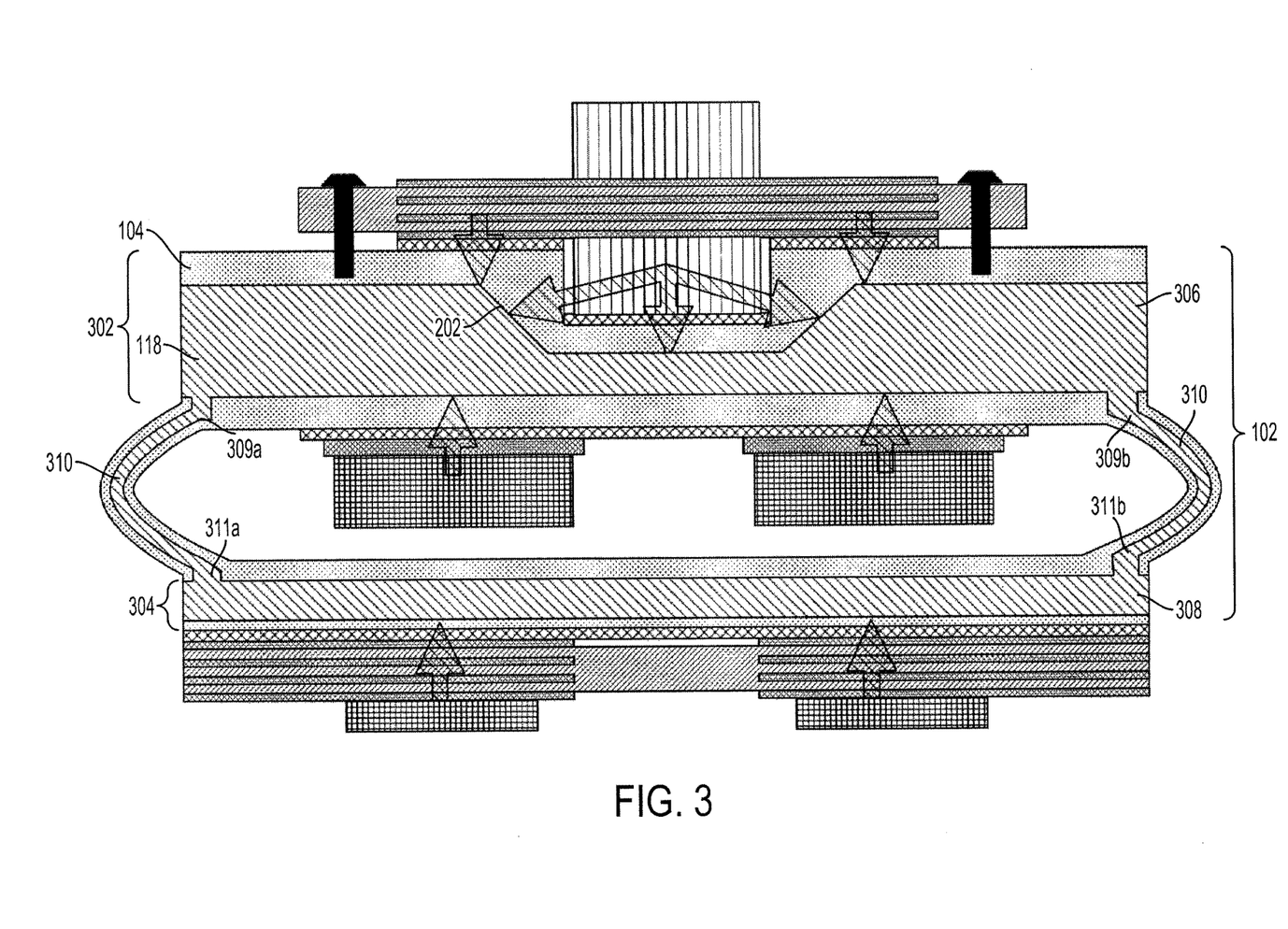
FIG. 3 is a cross-sectional view of the power electronic device of FIG. 1 having a thermal management assembly with a custom double-sided cooler with two coolant channels according to an aspect of the invention.

The cooler 104 may have multiple layers 302, 304, as shown in FIG. 3 for example. The multiple layers 302, 304 may include a first layer 302 and a second layer 304. The first layer 302 and the second layer 304 each may have a coolant channel 306, 308. The cooler 104 may have one or more fluid conduits 310 that connects the first coolant channel 306 with the second coolant channel 308. The fluid conduit 310 is configured to allow the coolant 118 to flow between the first layer 302 and the second layer 304 and transfer dissipated heat between the two layers 302, 304. The fluid conduit 310 may be made from a highly conductive metal, such as copper or aluminum. The fluid conduit 310 may be connected to the first layer 302 at one end and to the second layer 304 at an opposite end and have an inlet/outlet at each end to allow the coolant 118 to flow between the two layers 302, 304. The one or more fluid conduits 310 may be evenly spread out across the first layer 302 and the second layer 304 or may be connected to the first layer 302 and the second layer 304 at the ends of the coolant channels 306, 308. For example, the coolant 118 may flow into an inlet/outlet 309a-b connected to the first layer 302 of the coolant channel 306 and flow out of an inlet/outlet 311a-b connected to the second layer 304 of the coolant channel 308. The direction of flow of the coolant 118 may be clockwise or counterclockwise flowing from the first layer 302 to the second layer 304 and returning back to the first layer 302 through the one or more inlets/outlets 309a-b, 311a-b.

By having multiple layers 302, 304, the thermal management assembly 102 may further increase the amount or rate of heat dissipation in comparison to the thermal management assembly 102. For example, the first layer 302 may be positioned below the ferrite core 108 and the power board 106 and above the one or more power modules 112 so that the heat generated by the one or more PCB windings 110, the one or more power modules 112, and/or the ferrite core 108 may be primarily dissipated by the coolant 118 within the coolant channel 306 of the first layer 302. The second layer 304 may be positioned above the driver board 114 and the one or more gate drivers 116 so that the heat generated by the one or more gate drivers 116 is primarily dissipated by the coolant 118 within the coolant channel 308 of the second layer 304.

Figure 4:
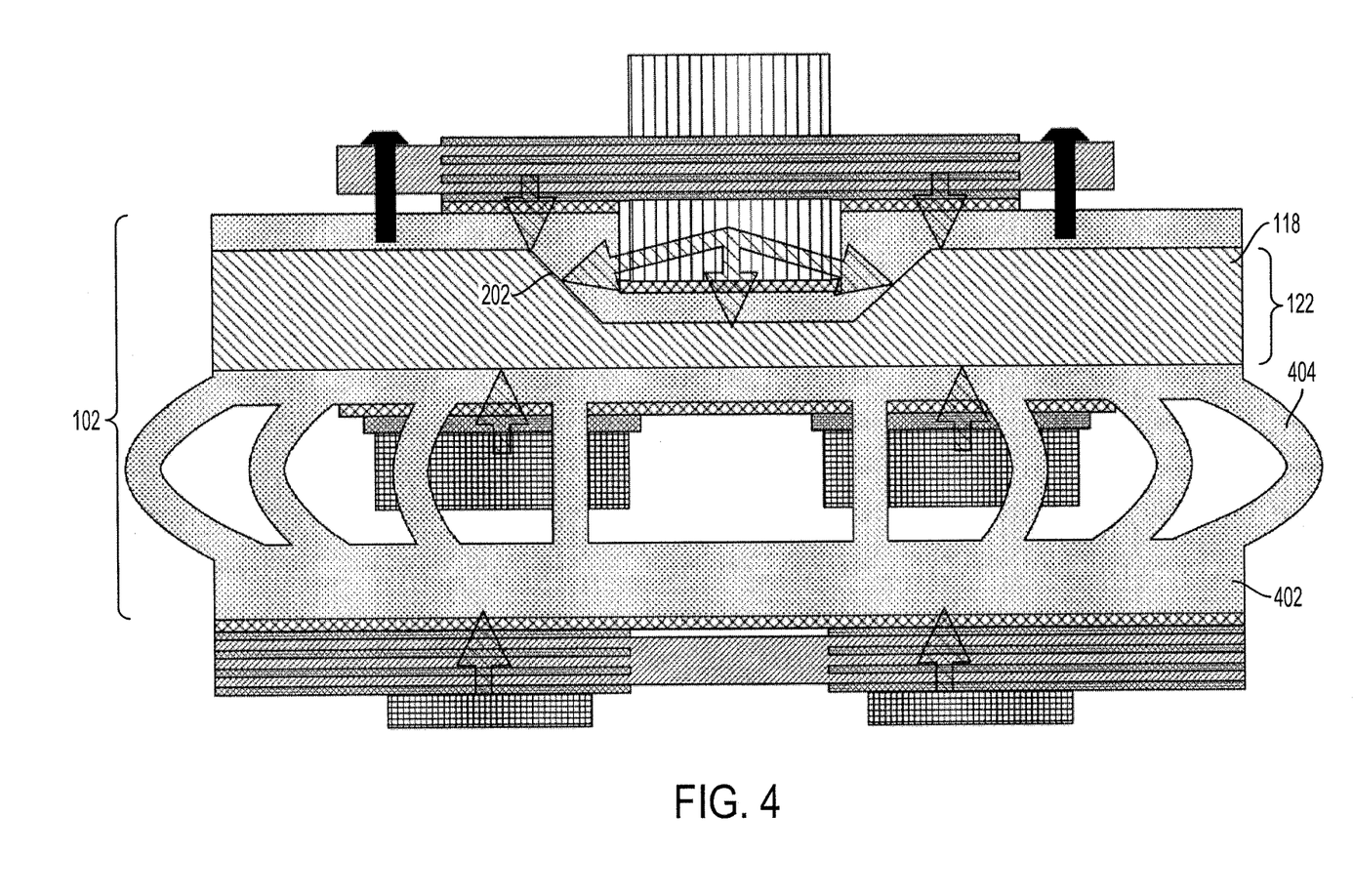
FIG. 4 is a cross-sectional view of the power electronic device of FIG. 1 having a thermal management assembly with a custom double-sided cooler with a coolant channel and a heat spreader according to an aspect of the invention.

In some implementations, the thermal management assembly 102 has a cooler 104 with a coolant channel 122 and a heat spreader 402, as shown in FIG. 4, for example. The coolant channel 122 may be configured to allow coolant 118 to flow within the coolant channel 122 to dissipate heat from the power components, such as the ferrite core 108, the one or more PCB windings 110, the one or more power modules and/or the one or more gate drivers 116. The cooler 104 may be connected to a heat spreader 402 through the one or more heat pipes 404.

The one or more heat pipes 404 manage the transfer of heat between the cooler 104 and the heat spreader 402. The one or more heat pipes 404 each may have an internal wick structure. One end of the heat pipe 404, such as the end positioned at the heat spreader 402, is an evaporator end and the opposite end of the heat pipe 404, such as the end positioned at the coolant channel 122 of the cooler 104, is a condenser. Liquid within the internal wick is evaporated at one end into vapor which travels through the heat pipe 404 within the interior vapor core to the condenser end where the heat is rejected to the cooler 104 and the vapor is condensed back into liquid. The internal wick then transports the condensed liquid back to the evaporator end of the heat pipe. The one or more heat pipes 404 may be made from copper or other metal and may be thermally/structurally connected to one or more portions of the cooler 104 and the heat spreader 402. The one or more heat pipes 404 may be spread evenly across the cooler 104 and the heat spreader 402 with one end connected to the cooler 104 and an opposite end connected to the heat spreader 402.

The heat spreader 402 spreads heat out over a geometry of the heat spreader 402 to dissipate the heat. The heat spreader 402 may dissipate the heat by passing the heat to a larger metal, graphite, diamond, or thermal composite surface where the heat may safely dissipate away from the power components.

The coolant 118 may be air and/or a liquid coolant. A liquid coolant may provide a higher rate or amount of heat dissipation than the air. The liquid coolant may be a water-glycol mixture or a refrigerant. The coolant is encapsulated within the coolant channel of the cooler 104.

The thermal management assembly 102 may be configured with any combination of the different features, such as the different shapes, geometries and/or positioning of the coolant channel 122 within the power electronic device 100, the different types of coolant, the use of a multi-layered cooler 104 and/or the use of a heat spreader 402. For example, FIG. 3 shows a multi-layer cooler 104 that has an inner surface that forms a step structure 202 within the coolant channel 306. In another example, FIG. 4 shows a thermal management assembly 102 having a heat spreader 402 along with a cooler 104 that has an inner surface that forms a step structure 202 within the coolant channel 306. The surface area enhancement fins may logically be incorporated in the cooler 104.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. An integrated thermal management assembly for power conversion devices having a driver board and a power board, comprising:

a double-sided cooler having a first layer that includes a first coolant channel that is positioned between an inner surface of the power board and an inner surface of the driver board, the first coolant channel extending an entire length of at least one of the driver board or the power board;

a coolant that flows within the first coolant channel and that is configured to dissipate heat projected through the double-sided cooler; and a thermal interface material that is positioned between a surface of the power board and a surface of the first layer and provides a heat path for heat generated within the power board to travel to the coolant that flows within the first coolant channel.

2. The integrated thermal management assembly of claim 1, wherein the double-sided cooler has a second layer that includes a second coolant channel.

3. The integrated thermal management assembly of claim 2, wherein the coolant flows within the second coolant channel, wherein the coolant is either a liquid coolant or air.

4. The integrated thermal management assembly of claim 3, wherein the double-sided cooler has one or more fluid conduits that connects the first layer and the second layer and are configured to pass the coolant between the first coolant channel of the first layer and the second coolant channel of the second layer.

5. The integrated thermal management assembly of claim 4, wherein the one or more fluid conduits include a first fluid conduit that is positioned at one end of the double-sided cooler and a second fluid conduit that is positioned at an opposite end of the double-sided cooler.

6. The integrated thermal management assembly of claim 1, wherein the double-sided cooler has a second layer that has a second coolant channel and is configured as a heat spreader.

7. The integrated thermal management assembly of claim 6, wherein liquid evaporates or air flows within a connection to the second coolant channel.

8. The integrated thermal management assembly of claim 7, wherein the double-sided cooler has a heat pipe that connects the first layer and the second layer and is configured to pass the evaporated liquid between the first layer and the second layer.

9. The integrated thermal management assembly of claim 1, wherein an inner surface of the first coolant channel is shaped as a step or a fin to increase a surface area that is in contact with the coolant within the first coolant channel.

10. The integrated thermal management assembly of claim 1, wherein an amount of heat that is dissipated is directly correlated with an amount of surface area of an inner surface of the first coolant channel that is in contact with the coolant.

11. The integrated thermal management assembly of claim 1, wherein an inner surface of the first coolant channel has one or more recesses or fins to increase a surface area that is in contact with the coolant within the first coolant channel.

12. An integrated thermal management assembly for a power conversion device having a driver board and a power board, comprising:

a double-sided cooler positioned between the driver board and the power board and having a first layer that includes a first surface, a second surface and a first cavity in between the first surface and the second surface and extending an entire length of at least one of the driver board or the power board, the first surface having a recess or a step;

a coolant that flows within the first cavity and that is configured to dissipate heat projected through the double-sided cooler; and a thermal interface material that is positioned between a surface of the power board and the first surface of the first layer and provides a heat path for heat generated within the power board to travel to the coolant that flows within the first cavity.

13. The integrated thermal management assembly of claim 12, wherein the coolant is a liquid coolant or air that dissipates the heat projected through the double-sided cooler.

14. The integrated thermal management assembly of claim 12, wherein the coolant is a liquid coolant, and wherein the double-sided cooler has a second layer that includes a second cavity.

15. The integrated thermal management assembly of claim 14, wherein the liquid coolant flows within the second cavity.

16. The integrated thermal management assembly of claim 15, wherein the double-sided cooler has a fluid conduit that connects the first layer and the second layer and is configured to pass the liquid coolant between the first layer and the second layer.

17. The integrated thermal management assembly of claim 12, wherein the double-sided cooler has a second layer that is a heat spreader and that includes a second cavity.

18. The integrated thermal management assembly of 12, wherein passive electronic elements including magnetic or capacitor components that dissipate heat are embedded within the recess or step.

19. The integrated thermal management assembly of claim 12, wherein the first surface has the step.

20. An integrated thermal management assembly for a power conversion device having a driver board and a power board, comprising:

a double-sided cooler positioned between the driver board and the power board and having a first layer that includes a first surface, a second surface and a first cavity in between the first surface and the second surface and a second layer that includes a second cavity; and a liquid coolant that flows within the first cavity and the second cavity, the liquid coolant being configured to dissipate heat projected through the double-sided cooler.

* * * * *